(12) United States Patent
Sharan et al.

(10) Patent No.: US 6,291,358 B1
(45) Date of Patent: Sep. 18, 2001

(54) PLASMA DEPOSITION TOOL OPERATING METHOD

(75) Inventors: Sujit Sharan; Gurtej S. Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/419,400

(22) Filed: Oct. 15, 1999

(51) Int. Cl.$^7$ .................................................. H01L 21/302
(52) U.S. Cl. .......................... 438/714; 438/905; 216/60; 156/345; 134/1.1
(58) Field of Search ..................................... 438/680, 706, 438/712, 714, 905; 134/1.1, 1.2; 216/60; 156/345

(56) References Cited

U.S. PATENT DOCUMENTS

| | | |
|---|---|---|
| 3,616,461 | 10/1971 | Gorin ................................... 204/312 |
| 4,222,838 | 9/1980 | Bhagat et al. .................... 204/192 E |
| 4,397,724 | 8/1983 | Moran ............................... 204/192 E |
| 4,436,584 | 3/1984 | Bernacki et al. ..................... 156/643 |
| 4,486,461 | 12/1984 | Ito et al. .................................. 427/38 |
| 4,529,474 | 7/1985 | Fujiyama et al. ..................... 156/643 |
| 4,786,352 | 11/1988 | Benzing ................................. 156/345 |
| 4,786,392 | 11/1988 | Kruchowski et al. ................ 204/298 |
| 4,795,880 | 1/1989 | Hayes et al. ..................... 219/121.52 |
| 5,129,994 | 7/1992 | Ebbing et al. ........................ 156/643 |
| 5,234,529 | 8/1993 | Johnson ................................ 156/345 |

(List continued on next page.)

FOREIGN PATENT DOCUMENTS 62-19912 9/1987 (JP) .

OTHER PUBLICATIONS

Product Bulletin, TCP ™ 9100 High–Density Oxide Etch System Productivity Solution for Advanced Oxide Etch, LAM Research Corporation, Fremont, CA (1998 or before) 4 pages.

Primary Examiner—Benjamin L. Utech
Assistant Examiner—Kin-Chan Chen
(74) Attorney, Agent, or Firm—Wells, St. John, Roberts, Gregory & Matkin P.S.

(57) ABSTRACT

Material is separately plasma deposited over a plurality of semiconductor substrates within a chamber of a plasma deposition tool. The substrates are received over a susceptor during the respective depositings. Intermediate at least some of the plasma depositings, a reactive chamber treating gas is provided within the chamber in a nonplasma environment and with at least a majority of the susceptor being outwardly exposed. Intermediate at least some of the plasma depositings, internal chamber surfaces are at least partially cleaned in a plasma environment using a cleaning gas and with at least a majority of the susceptor being covered. A plasma deposition tool operating method sequentially includes first plasma depositing a material over a first semiconductor substrate received over a susceptor within a chamber of a plasma deposition tool. The first depositing results in a residue forming over at least some internal chamber surfaces. The first substrate is removed from the chamber. With at least a majority of the susceptor being outwardly exposed, a cleaning gas is injected into the chamber under nonplasma conditions to etch at least some residue. A second semiconductor substrate is positioned within the chamber over the susceptor and second plasma depositing of a material thereover occurs. The second plasma depositing results in a residue forming over at least some internal chamber surfaces. The second substrate is removed from the chamber. At least a majority of the susceptor is covered and at least some residue is plasma cleaned from the internal chamber surfaces.

65 Claims, 3 Drawing Sheets

U.S. PATENT DOCUMENTS

| | | | |
|---|---|---|---|
| 5,252,178 | 10/1993 | Moslehi | 156/643 |
| 5,269,881 | 12/1993 | Sekiya et al. | 156/643 |
| 5,277,751 | 1/1994 | Ogle | 156/643 |
| 5,298,466 | 3/1994 | Brasseur | 437/228 |
| 5,346,578 | 9/1994 | Benzing et al. | 156/345 |
| 5,405,491 | 4/1995 | Shahvandi et al. | 156/643 |
| 5,433,812 | 7/1995 | Cuomo et al. | 156/345 |
| 5,449,432 | 9/1995 | Hanawa | 156/643.1 |
| 5,464,031 | 11/1995 | Buley et al. | 134/1 |
| 5,523,261 | 6/1996 | Sandhu | 437/228 |
| 5,585,012 | 12/1996 | Wu et al. | 216/71 |
| 5,647,913 | 7/1997 | Blalock | 118/723 |
| 5,658,391 | 8/1997 | Buley et al. | 134/1.1 |
| 5,679,211 | 10/1997 | Huang | 156/643.1 |
| 5,780,359 | 7/1998 | Brown et al. | 438/659 |
| 5,812,403 * | 9/1998 | Fong et al. | 364/468.28 |
| 5,814,155 | 9/1998 | Solis et al. | 134/1 |
| 5,817,534 | 10/1998 | Ye et al. | 438/10 |
| 5,824,607 | 10/1998 | Trow et al. | 438/732 |
| 5,869,401 | 2/1999 | Brunemeier et al. | 438/710 |
| 5,879,574 * | 3/1999 | Sivaramakrishnan et al. | 216/60 |
| 5,882,414 | 3/1999 | Fong et al. | 118/723 R |
| 5,904,778 | 5/1999 | Lu et al. | 118/723 R |
| 5,920,796 | 7/1999 | Wang et al. | 438/700 |
| 5,950,092 | 9/1999 | Figura et al. | 438/399 |
| 5,954,887 * | 9/1999 | Hatano | 134/2 |
| 5,963,834 * | 10/1999 | Hatano et al. | 438/680 |

* cited by examiner

FIG. 1

PLASMA DEPOSITION TOOL OPERATING METHOD

TECHNICAL FIELD

This invention relates to methods of operating plasma deposition tools.

BACKGROUND OF THE INVENTION

Plasma enhanced chemical vapor deposition tools include a reaction chamber having a susceptor upon which one or more semiconductor substrate(s) lie during a plasma deposition of material over the substrate(s). Unfortunately, not all of the depositing material forms on the wafer. Some of it, as well as reaction byproducts, deposits on internal surfaces of the reaction chamber. This includes the sidewalls and other components therein, such as gas injectors and heaters. Further, depending on the chemistry utilized, some of the undesired deposited material on the reactor components can be dislodged in subsequent depositions and end up as contaminants deposited on the substrates.

One particular process where such is problematic involves the plasma enhanced chemical vapor deposition of thin titanium films utilizing $TiCl_4$ and $H_2$ as reactive precursors. Reaction byproducts from the deposition get deposited on internal chamber sidewalls and other components. These byproducts can be dislodged in subsequent depositions, and deposit on the substrates which can result in incredible yield loss of dies on the substrates being processed.

The present accepted technique to largely prevent this from occurring utilizes a $Cl_2$ plasma clean of the internal reactor components between each separate plasma depositing step. Many plasma reactor susceptors are, however, made of a material which is corrosive to attack by a chlorine containing plasma, particularly at elevated temperatures. Aluminum nitride is one example such susceptor material. Accordingly, during the chlorine plasma cleans, the susceptor is covered with a suitable and ultimately discardable protector typically in the shape of a conventional wafer which the tool is designed to process. Accordingly at the conclusion of a plasma deposition, the processed substrate is removed from the chamber, and a dummy protectable plate placed over the susceptor. Plasma cleaning with the chlorine gas then occurs, followed by removal of the dummy protector and placement of another semiconductor substrate upon the susceptor for processing. This, of course, significantly adversely affects throughput because of all the separate cleanings and required robotic placement of dummy plates over the susceptor during the plasma cleanings. Conducting such plasma cleanings every second, third or more depositings has been attempted, but with less than satisfactory results. Considerable yield loss occurs, and/or process uniformity from wafer to wafer between cleanings is significantly adversely affected.

Accordingly, it would be desirable to develop improved processes which better contend with material which deposits on internal chamber surfaces during plasma depositions on semiconductor substrates.

SUMMARY

The invention comprises methods of operating a plasma deposition tool. In but one implementation, material is separately plasma deposited over a plurality of semiconductor substrates within a chamber of a plasma deposition tool. The substrates are received over a susceptor within the chamber during the respective depositings. Intermediate at least some of the plasma depositings, a reactive chamber treating gas is provided within the chamber in a nonplasma environment and with at least a majority of the susceptor being outwardly exposed. Further, intermediate at least some of the plasma depositings, internal chamber surfaces are at least partially cleaned in a plasma environment using a cleaning gas and with at least a majority of the susceptor being covered.

In one implementation, a plasma deposition tool operating method sequentially includes first plasma depositing a material over a first semiconductor substrate received over a susceptor within a chamber of a plasma deposition tool. The first depositing results in a residue forming over at least some internal chamber surfaces. The first substrate is then removed from the chamber. With at least a majority of the susceptor outwardly exposed, a cleaning gas is injected into the chamber under nonplasma conditions to etch at least some residue from the internal chamber surfaces. A second semiconductor substrate is then positioned within the chamber over the susceptor and second plasma depositing of a material thereover is conducted. The second plasma depositing results in a residue forming over at least some internal chamber surfaces. The second substrate is then removed from the chamber. At least a majority of the susceptor is covered and at least some residue is plasma cleaned from the internal chamber surfaces.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
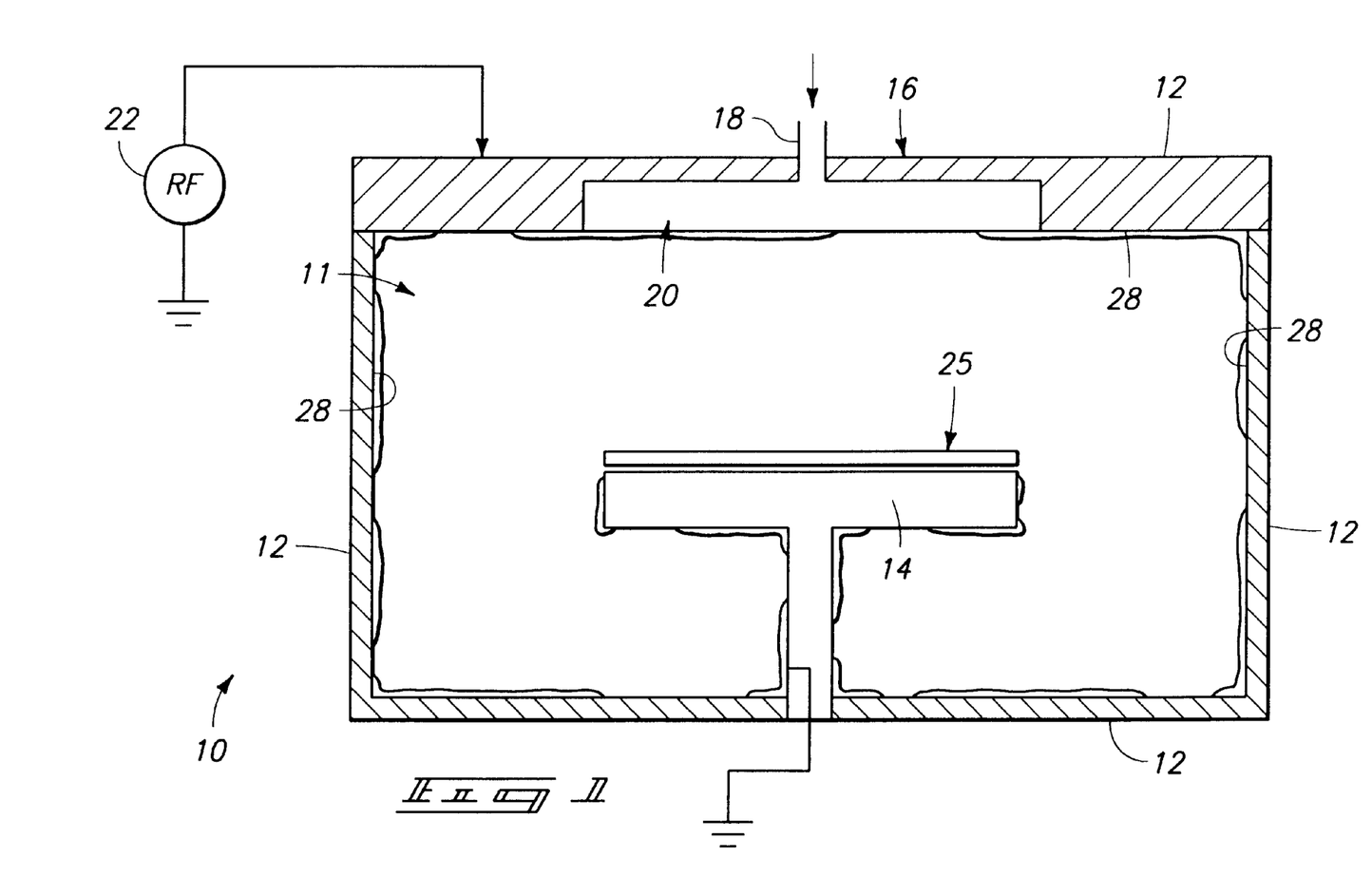
FIG. 1 is a diagrammatic sectional view of a plasma deposition tool at one processing step in accordance with an aspect of the invention.

Referring to FIG. 1, a plasma deposition tool in operation in accordance with an aspect of the invention is indicated generally with reference numeral 10. Such comprises chamber walls 12 defining a deposition chamber 11 having a susceptor 14 received therein for supporting the substrates to be deposited upon. Susceptor 14 is shown as being grounded, and would also be configured with a heater (not shown) in preferred aspects of the invention providing suitably high elevated temperatures to the substrate or substrates received upon susceptor 14. A top wall 16 of chamber 10 includes at least one gas inlet 18 and a showerhead 20 positioned over susceptor 14 for injecting of deposition and other gases to within chamber 11. Top wall 16 is powered by a suitable power source 22 for providing desired energy for achieving plasma conditions with respect to the injected gases within chamber 11, when desired. The FIG. 1 illustrated plasma enhanced chemical vapor deposition reactor is but one example, with other designs of course being possible. The invention was reduced to practice utilizing the Applied Materials' Centura deposition tool, wherein the internal surfaces of chamber walls 12 are principally comprised of nickel, and the outer exposed surface of susceptor 14 upon which substrates lie is made of aluminum nitride.

A semiconductor substrate 25 is received atop susceptor 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In accordance with an aspect of the invention, desired material or materials are separately plasma deposited over a plurality of semiconductor substrates within chamber 11 which are received over susceptor 14 therewithin during the respective depositings. Depending on the tool, one or more substrates might be received over the susceptor during the plasma depositings. Regardless, there will be at least two semiconductor wafers (i.e., a plurality) separately plasma deposited upon in different steps. The invention was reduced to practice in a plasma enhanced chemical vapor deposition of elemental titanium using $TiCl_4$ and $H_2$ as primary precursors. Example conditions include a power to electrode/wall 16 of 400 W, a susceptor temperature of 650° C., a chamber pressure of 4 Torr, and gas flows of $TiCl_4$ at 100 mg./min., $H_2$ flow at 7500 sccm and Ar flow at 5000 sccm. Such a deposition results in formation of titanium (not shown) over substrate 25, and also depositing of a residue 28 over at least some internal chamber surfaces. Residue 28 can comprise titanium and/or reaction byproducts from the desired plasma deposition occurring on substrate 25.

Figure 2:
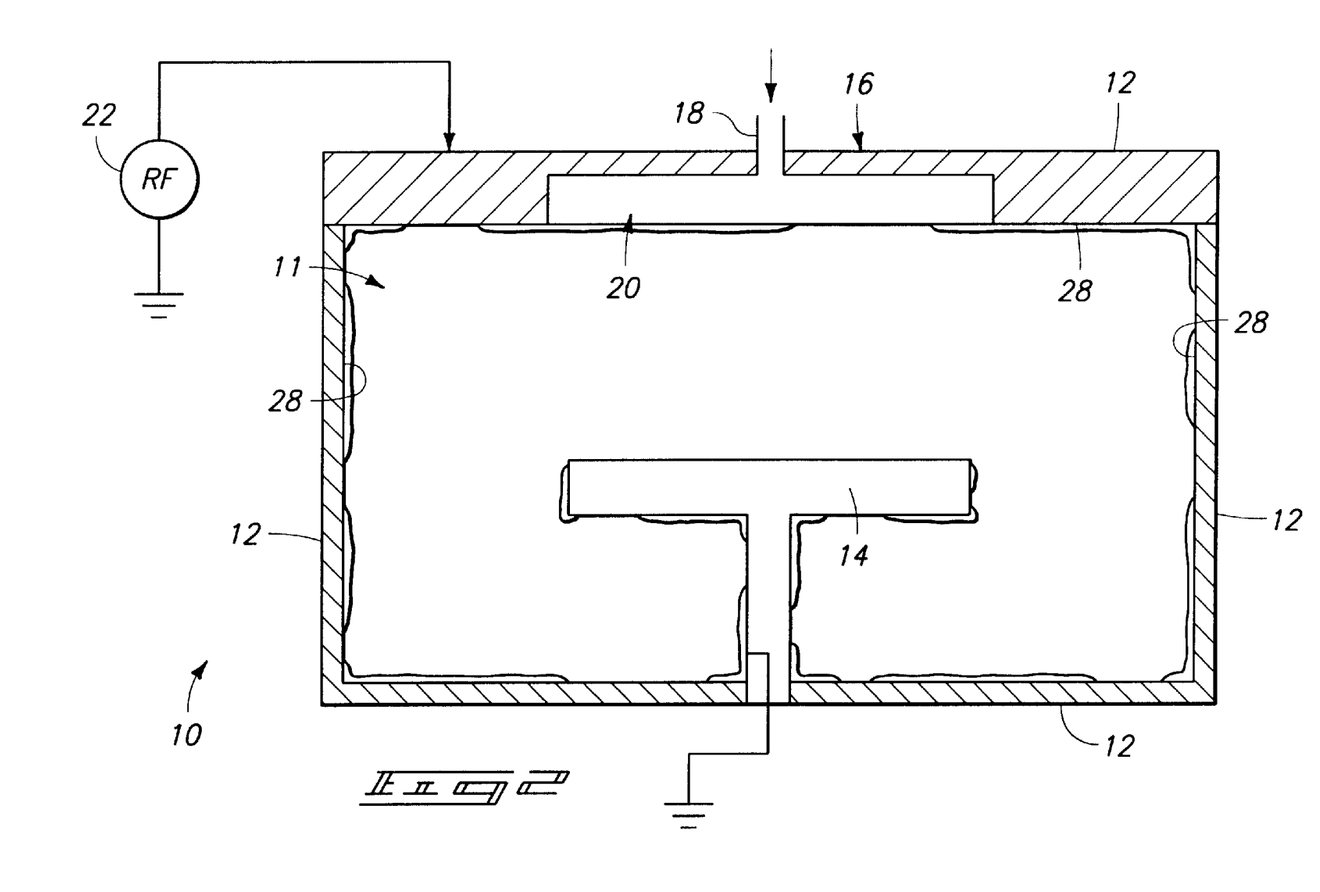
FIG. 2 is a view of the FIG. 1 tool at a processing step subsequent to that depicted by FIG. 1.

Referring to FIG. 2, substrate 25 has been removed from chamber 11, thus leaving at least a majority of susceptor 14 outwardly exposed where it was previously covered by a wafer. Preferably and as shown, the entirety of susceptor 14 is shown as being outwardly exposed.

In accordance with but one aspect of the invention, a reactive chamber treating gas is provided within chamber 11 in a nonplasma environment with at least a majority of susceptor 14 being outwardly exposed. Subsequently, a second semiconductor substrate is positioned within chamber 11 over susceptor 14, and material is thereafter plasma deposited thereover. The processing can then be repeated subsequently with one or more additional substrates to be processed.

Alternately considered and in one preferred embodiment, some set of semiconductor substrates is subjected to plasma deposition conditions. Individual set elements might constitute only one or more than one semiconductor substrate. Intermediate at least some of the plasma depositings, and preferably in between each plasma depositing, a reactive chamber treating gas is provided within the chamber in a nonplasma environment with at least a majority of susceptor 14 being outwardly exposed. Upon completion of plasma depositing upon the set, the last deposited substrate is removed from the chamber and at least a majority of the susceptor is covered, and plasma cleaning is conducted to remove at least some of any remaining residue from the internal surfaces of chamber 11. Accordingly, intermediate at least some of the plasma depositings, a reactive chamber treating gas is provided within the chamber in a nonplasma environment with at least a majority of the susceptor being outwardly exposed. Further, intermediate at least some of the plasma depositings, internal chamber surfaces are at least partially cleaned in a plasma environment using a cleaning gas and with at least a majority of susceptor 14 being covered.

In a reduction-to-practice process, the reactive chamber treating gas used within the chamber in a nonplasma environment included a chlorine component, such as $Cl_2$ or $ClF_3$. Gas flows were between 250 sccm and 3000 sccm of the chlorine containing gas. Reactor pressure was maintained at from 5 Torr to 15 Torr. Temperatures of the susceptor 14 and lid 16 were maintained at the deposition temperatures for the substrates during the depositions and at all times intermediate thereof. The invention is seen to have its greatest applicability where the susceptor is heated to a temperature greater than or equal to 300° C., and more preferably to greater than or equal to 500° C. during both the depositings, intermediate thereof, and during the reactive chamber treating. Further and regardless, the susceptor temperature is preferably maintained constant during the depositings and intermediate the depositings including during the nonplasma environment exposure to the reactive chamber treating gas. An example specific susceptor temperature in the above-described titanium deposition is 650° C.

A reactive chamber treating gas in accordance with the invention has been discovered to interface or react in some way with residue material 28, enabling plasma cleaning of internal chamber surfaces to not have to occur intermediate each deposition processing step. Accordingly, a set of semiconductor substrates can be processed in the above-described manner without intermediate cleaning occurring between each deposition with respect to internal chamber surfaces within a plasma environment when at least a majority of the susceptor is covered. This can have a significant favorable impact on throughput as well as substrate yield. Preferably to maximize throughput and achieve acceptable process uniformity and yield, the set numbers at least five, more preferably at least 10, and most preferably at least 15 substrates intermediate the respective plasma environment cleanings.

Further, the nonplasma environment reactive chamber treating gas exposure might not be utilized intermediate each of the respective plasma depositings, but such is preferred. Further, the reactive chamber treating gas might be the same gas or gas mix used in all the nonplasma environment treatings, or might comprise different gases at different treatings. Further, one or more of the treating gases might be the same or different with respect to the plasma environment cleaning gas.

Figure 3:
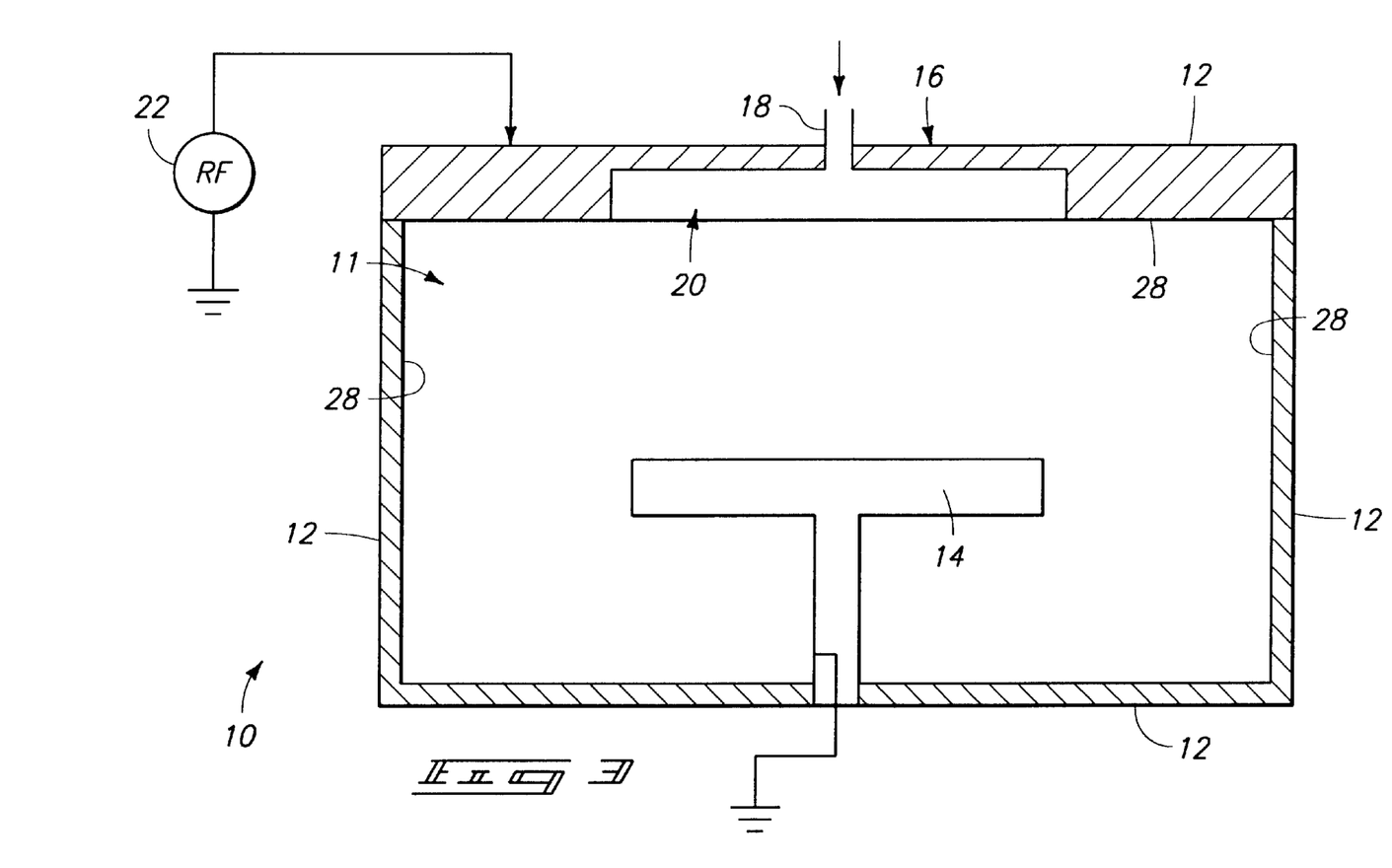
FIG. 3 is a view of the FIG. 1 tool at a processing step subsequent to that depicted by FIG. 2.

By way of example only, in the invention's actual reduction-to-practice, the plasma cleaning gas utilized was $Cl_2$ at chamber pressure at from 1 Torr to 4 Torr and chamber component temperatures maintained at the same conditions as during the depositions, which was 650° C. for the susceptor. $Cl_2$ flow was maintained at from 100 sccm to 1000 sccm, Ar flow at from 50 to 800 sccm, and power to the top electrode/wall kept between 100 W and 600 W. Accordingly, such provides but one example wherein a common gas is utilized for the nonplasma environment reactive chamber treating gas exposure and for the plasma environment cleaning. Preferably, the plasma cleaning results in removal of substantially all remaining deposits or residue within chamber 11, thus ultimately producing a cleaned chamber as depicted in FIG. 3.

In a most preferred implementation, processing is conducted whereby a greater number of nonplasma environment treatings occur than the plasma environment cleanings. Susceptor temperature during the plasma cleaning is also preferably in accordance with the preferred implementations kept at above 300° C., more preferably greater than 500° C., and regardless preferably kept at the same susceptor temperature as during the plasma depositing. Thereby most preferably, susceptor temperature is maintained substantially constant during processing of a given plurality or specific set of substrates.

The reactive chamber treating gas might function or operate in a number of different manners. For example, the reactive treating gas might passivate the deposits within chamber 11 to ultimately restrict their removal in at least one of a subsequent of the plasma depositings. Such might occur by, for example, reaction to form adhesive chlorides or other materials where chlorine is not used as a nonplasma treating gas component.

Alternately, the reactive chamber treating gas might in essence constitute a cleaning gas within a nonplasma environment which etches deposits from within the chamber. Such deposits may not be completely etched away by the nonplasma environment, but nevertheless a sufficient volume removed therefrom such that extended processings between plasma environment cleanings can be obtained. In accordance with the invention, treatment in the above-described manner has resulted in extending the interval between plasma environment cleanings, but has not eliminated the same. Further, multiple nonplasma environment reactive chamber treating gas exposure steps are preferred intermediate plasma environment cleanings where more than two wafers are being processed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A plasma deposition tool operating method comprising:
   separately plasma depositing a material over a plurality of semiconductor substrates within a chamber of a plasma deposition tool using plasma within the chamber, respective substrates being received over a susceptor within the chamber during the respective depositings;
   intermediate at least some of the plasma depositings, nonplasma environment treating by providing a reactive chamber treating gas within the chamber in a nonplasma environment and with at least a majority of the susceptor being outwardly exposed;
   intermediate at least some of the plasma depositings, plasma environment cleaning by at least partially cleaning internal chamber surfaces in a plasma environment using a cleaning gas and with at least a majority of the susceptor being covered; and
   conducting a greater number of the nonplasma environment treatings than the plasma environment cleanings.

2. The method of claim 1 wherein the reactive treating gas etches deposits from within the chamber.

3. The method of claim 1 wherein the reactive treating gas does not etch deposits from within the chamber.

4. The method of claim 1 wherein the reactive treating gas passivates deposits within the chamber to restrict their removal in at least one of a subsequent of the plasma depositings.

5. A plasma deposition tool operating method comprising:
   separately plasma depositing a material over a set of semiconductor substrates within a chamber of a plasma deposition tool using plasma within the chamber, respective substrates being received over a susceptor within the chamber during the respective depositings, the susceptor being heated to a temperature greater than or equal to 300° C. during the depositings;
   intermediate at least some of the plasma depositings, nonplasma environment treating by providing a reactive chamber treating gas within the chamber in a nonplasma environment and with the susceptor being outwardly exposed, the susceptor not falling to below 300° C. between the depositings;
   after depositing the material over the set of substrates, plasma environment cleaning by at least partially cleaning the internal chamber surfaces in a plasma environment using a cleaning gas and with at least a majority of the susceptor being covered and the susceptor being heated to at least 300° C., the susceptor not falling to below 300° C. between depositing the material over the set of substrates and the plasma environment cleaning; and
   conducting a greater number of the nonplasma environment treatings than the plasma environment cleanings.

6. The method of claim 5 wherein individual elements of the set comprise only a single semiconductor substrate.

7. The method of claim 5 wherein individual elements of the set comprise multiple semiconductor substrates.

8. The method of claim 5 wherein the reactive treating gas etches deposits from within the chamber.

9. The method of claim 5 wherein the reactive treating gas does not etch deposits from within the chamber.

10. The method of claim 5 wherein the reactive treating gas passivates deposits within the chamber to restrict their removal in at least one of a subsequent of the plasma depositings.

11. A plasma deposition tool operating method comprising:
    separately plasma depositing a material over a set of semiconductor substrates within a chamber of a plasma deposition tool using plasma within the chamber, respective substrates being received over a susceptor within the chamber during the respective depositings;
    intermediate each of the plasma depositings, nonplasma environment treating by providing a reactive chamber treating gas within the chamber in a nonplasma environment and with at least a majority of the susceptor being outwardly exposed;
    after depositing the material over the set of substrates, plasma environment cleaning by at least partially cleaning internal chamber surfaces in a plasma environment using a cleaning gas and with at least a majority of the susceptor being covered; and
    conducting a greater number of the nonplasma environment treatings than the plasma environment cleanings.

12. The method of claim 11 wherein the reactive treating gas etched deposits from within the chamber.

13. The method of claim 11 wherein the reactive treating gas does not etch deposits from within the chamber.

14. The method of claim 11 wherein the reactive treating gas passivates deposits within the chamber to restrict their removal in at least one of a subsequent of the plasma depositings.

15. A plasma deposition tool operating method comprising:

separately plasma depositing a material over a plurality of semiconductor substrates within a chamber of a plasma deposition tool using plasma within the chamber, respective substrates being received over a susceptor within the chamber during the respective depositings;

intermediate at least some of the plasma depositings, at least partially cleaning internal chamber surfaces in a nonplasma environment using a cleaning gas and with at least a majority of the susceptor being outwardly exposed;

intermediate at least some of the plasma depositings, at least partially cleaning internal chamber surfaces in a plasma environment using a cleaning gas and with at least a majority of the susceptor being covered; and conducting a greater number of the nonplasma environment cleanings than the plasma environment cleanings.

16. The method of claim 15 wherein individual elements of the set comprise only a single semiconductor substrate.

17. The method of claim 15 wherein individual elements of the set comprise multiple semiconductor substrates.

18. The method of claim 15 wherein the same cleaning gas is used in all said nonplasma environment cleanings.

19. The method of claim 15 wherein the same cleaning gas is used in all said plasma environment cleanings.

20. The method of claim 15 wherein at common cleaning gas is used in all said nonplasma environment cleanings and in all said plasma environment cleanings.

21. The method of claim 15 wherein susceptor temperature during the depositings and intermediate the depositings is kept at greater than or equal to 300° C.

22. The method of claim 15 wherein susceptor temperature during the depositings and intermediate the depositings is kept at greater than or equal to 500° C.

23. The method of claim 15 wherein susceptor temperature during the depositings and intermediate the depositings is kept substantially constant.

24. A plasma deposition tool operating method sequentially comprising:

first plasma depositing a material over a first semiconductor substrate received over a susceptor within a chamber of a plasma deposition tool using plasma within the chamber, the first depositing resulting in a residue forming over at least some internal chamber surfaces;

removing the first substrate from the chamber;

with at least a majority of the susceptor outwardly exposed, injecting a cleaning gas into the chamber under nonplasma conditions to etch at least some residue from the internal chamber surfaces;

positioning a second semiconductor substrate within the chamber over the susceptor and second plasma depositing a material thereover using plasma within the chamber, the second plasma depositing resulting in a residue forming over at least some internal chamber surfaces;

removing the second substrate from the chamber; and covering at least a majority of the susceptor and plasma cleaning at least some residue from the internal chamber surfaces using plasma within the chamber.

25. The method of claim 24 wherein only some of the residue is etched away from internal chamber surfaces under the nonplasma conditions.

26. The method of claim 24 further comprising prior to the covering and plasma cleaning, positioning a third semiconductor substrate within the chamber over the susceptor and third plasma depositing a material thereover, and then removing the third substrate from the chamber.

27. The method of claim 24 wherein no other semiconductor substrate is plasma deposited upon within the chamber intermediate the first and second plasma depositing.

28. The method of claim 24 wherein no semiconductor substrate is plasma deposited upon within the chamber intermediate the first and second plasma depositing.

29. The method of claim 24 wherein susceptor temperature during the first and second depositings, and intermediate thereof, is kept at greater than or equal to 500° C.

30. The method of claim 29 wherein susceptor temperature during the plasma cleaning, and intermediate the second depositing and the plasma cleaning, is kept at greater than or equal to 500° C.

31. The method of claim 24 wherein susceptor temperature during the first and second depositings, and intermediate thereof, is kept substantially constant.

32. The method of claim 25 wherein susceptor temperature during the first and second depositings, intermediate thereof and during the plasma cleaning, is kept substantially constant.

33. A plasma deposition tool operating method comprising:

separately plasma depositing a material over a set of semiconductor substrates within a chamber of a plasma deposition tool using plasma within the chamber, respective substrates being received over a susceptor within the chamber during the respective depositings;

intermediate each of the plasma depositings, at least partially cleaning internal chamber surfaces in a nonplasma environment using a cleaning gas and with at least a majority of the susceptor being outwardly exposed;

after depositing the material over the set of substrates, at least partially cleaning internal chamber surfaces in a plasma environment using a cleaning gas and with at least a majority of the susceptor being covered; and conducting a greater number of the nonplasma environment cleanings than the plasma environment cleanings.

34. The method of claim 33 wherein the set numbers at least 5.

35. The method of claim 33 wherein the set numbers at least 10.

36. The method of claim 33 wherein the set numbers at least 15.

37. The method of claim 33 wherein the same cleaning gas is used in all said nonplasma environment cleanings.

38. The method of claim 33 wherein the same cleaning gas is used in all said plasma environment cleanings.

39. The method of claim 33 wherein a common cleaning gas is used in all said nonplasma environment cleaning s and in all said plasma environment cleanings.

40. The method of claim 33 wherein the cleaning gases used in all said nonplasma environment cleanings and in all said plasma environment cleanings comprise Cl.

41. The method of claim 33 wherein the cleaning gases used in all said nonplasma environment cleanings and in all said plasma environment cleanings comprise $Cl_2$.

42. The method of claim 33 wherein susceptor temperature during the depositings and intermediate the depositings is kept at greater than or equal to 300° C.

43. The method of claim 33 wherein susceptor temperature during the depositings and intermediate the depositings is kept at greater than or equal to 500° C.

44. The method of claim 33 wherein susceptor temperature during the depositings and intermediate the depositings is kept substantially constant.

45. A plasma deposition tool operating method comprising:

separately plasma depositing a material over a set of semiconductor substrates within a chamber of a plasma deposition tool using plasma within the chamber, respective substrates being received over a susceptor within the chamber during the respective depositings, the susceptor being heated to a temperature greater than or equal to 300° C. during the depositings;

intermediate at least some of the plasma depositings, at least partially cleaning the internal chamber surfaces in a nonplasma environment using a cleaning gas and with the susceptor being outwardly exposed, the susceptor not falling to below 300° C. between the depositings;

after depositing the material over the set of substrates, at least partially cleaning the internal chamber surfaces in a plasma environment using a cleaning gas and with at least a majority of the susceptor being covered and the susceptor being heated to at least 300° C., the susceptor not falling to below 300° C. between depositing the material over the set of substrates and the plasma environment cleaning; and conducting a greater number of the nonplasma environment cleanings than the plasma environment cleanings.

46. The method of claim 45 wherein the susceptor is heated to a temperature greater than 500° C. during the depositings, and not allowed to fall below 500° C. between the depositings or below 500° C. between depositing the material over the set of substrates and the plasma environment cleaning.

47. The method of claim 45 wherein during the depositings and intermediate the depositing susceptor temperature is kept substantially constant.

48. The method of claim 45 wherein during the depositings, intermediate the depositings, and during the plasma environment cleaning, susceptor temperature is kept substantially constant.

49. The method of claim 45 comprising conducting a nonplasma environment cleaning intermediate each of the plasma depositings for the set.

50. The method of claim 45 wherein the same cleaning gas is used in all said nonplasma environment cleanings.

51. The method of claim 45 wherein the same cleaning gas is used in all said plasma environment cleanings.

52. The method of claim 45 wherein a common cleaning gas is used in all said nonplasma environment cleanings and in all said plasma environment cleanings.

53. The method of claim 45 wherein the set numbers at least 5.

54. The method of claim 45 wherein the set numbers at least 10.

55. A plasma deposition tool operating method comprising:

separately plasma depositing a material over a set of semiconductor substrates within a chamber of a plasma deposition tool using plasma within the chamber, respective substrates being received over a susceptor within the chamber during the respective depositings, the susceptor comprising an outer aluminum nitride comprising surface;

intermediate at least some of the plasma depositings, at least partially cleaning internal chamber surfaces in a nonplasma environment using a Cl containing cleaning gas and with at least a majority of the aluminum nitride comprising surface being outwardly exposed;

after depositing the material over the set of substrates, at least partially cleaning internal chamber surfaces in a plasma environment using a Cl containing cleaning gas and with at least a majority of the aluminum nitride comprising surface being covered; and conducting a greater number of the nonplasma environment cleanings than the plasma environment cleanings.

56. The method of claim 55 wherein the same chlorine containing cleaning gas is used in all said nonplasma environment cleanings.

57. The method of claim 56 wherein the Cl containing cleaning gas comprises $Cl_2$ in all said nonplasma environment cleanings.

58. The method of claim 56 wherein the Cl containing cleaning gas consists essentially of $Cl_2$ in all said nonplasma environment cleanings.

59. The method of claim 55 wherein the material comprises titanium using precursors comprising $TiCl_4$ and $H_2$, and the Cl containing cleaning gas used in all said nonplasma environment cleanirngs comprises $Cl_2$.

60. The method of claim 55 wherein the material comprises titanium using precursors comprising $TiCl_4$ and $H_2$, and the Cl containing cleaning gas used in all said nonplasma environment cleanings comprises $ClF_3$.

61. The method of claim 55 comprising conducting a nonplasma environment cleaning intermediate each of the plasma depositings for the set.

62. The method of claim 61 wherein the material comprises titanium using precursors comprising $TiCl_4$ and $H_2$.

63. The method of claim 61 wherein susceptor temperature during the depositings and intermediate the depositings is kept at greater than or equal to 300° C.

64. The method of claim 61 wherein susceptor temperature during the depositings and intermediate the depositings is kept at greater than or equal to 500° C.

65. The method of claim 61 wherein during the depositings and intermediate the depositings, susceptor temperature is kept substantially constant.

* * * * *

UNITED STATES PATENT AND TRADEMARK OFFICE
CERTIFICATE OF CORRECTION

PATENT NO. : 6,291,358 B1
DATED : September 18, 2001
INVENTOR(S) : Sujit Shara et al.

It is certified that error appears in the above-identified patent and that said Letters Patent is hereby corrected as shown below:

<u>Title page,</u>
Item [57], ABSTRACT,
Line 6, replace "nonpiasma" with -- nonplasma --

<u>Column 2,</u>
Line 36, delete "If"

<u>Column 6,</u>
Line 59, replace "etched" with -- etches --

<u>Column 8,</u>
Line 17, replace "25" with -- 24 --

Signed and Sealed this

Sixteenth Day of July, 2002

Attest:

JAMES E. ROGAN
Attesting Officer          Director of the United States Patent and Trademark Office